(12) United States Patent  (10) Patent No.: US 8,037,445 B2
Poirier et al.  (45) Date of Patent: Oct. 11, 2011

(54) SYSTEM FOR AND METHOD OF CONTROLLING A VLSI ENVIRONMENT

(75) Inventors: Christopher A. Poirier, Fort Collins, CO (US); Samuel D. Naffziger, Fort Collins, CO (US); Christopher J. Bostak, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1707 days.

(21) Appl. No.: 10/644,625

(22) Filed: Aug. 20, 2003

(65) Prior Publication Data

US 2005/0040810 A1 Feb. 24, 2005

(51) Int. Cl.
G06F 17/50 (2006.01)
G06F 11/22 (2006.01)
G06F 1/26 (2006.01)
G06F 1/22 (2006.01)
G06F 11/00 (2006.01)
G01K 1/08 (2006.01)

(52) U.S. Cl. ............ 716/136; 714/10; 714/22; 713/320; 374/141

(58) Field of Classification Search .............. 716/2, 136; 714/10, 22; 713/320; 374/141
See application file for complete search history.

(56) References Cited

U.S. PATENT DOCUMENTS 6,908,227 B2 * 6/2005 Rusu et al. ................... 374/141
6,948,082 B2 * 9/2005 Gschwind et al. ............ 713/320

OTHER PUBLICATIONS

U.S. Appl. No. 10/644,559, C. J. Bostak, et al.
U.S. Appl. No. 10/644,376, C. A. Poirier et al.
U.S. Appl. No. 10/644,542, C. J. Bostak, et al.

* cited by examiner

Primary Examiner — Stacy Whitmore

(57) ABSTRACT

An apparatus comprising an integrated circuit on a VLSI die, and an embedded micro-controller constructed on the VLSI die, the micro-controller adapted to monitor and control the VLSI environment to optimize the integrated circuit operation. Another embodiment of the invention is directed to a method for monitoring and controlling an integrated circuit comprising providing an embedded micro-controller on a same VLSI die as the integrated circuit, monitoring and controlling a VLSI environment of the integrated circuit with the embedded micro-controller.

29 Claims, 1 Drawing Sheet

SYSTEM FOR AND METHOD OF CONTROLLING A VLSI ENVIRONMENT

CROSS-REFERENCE TO RELATED APPLICATIONS

This application is related to U.S. Patent Application Publication No. 2005-0040900, entitled "METHOD AND SYSTEM FOR CALIBRATION OF A VOLTAGE CONTROLLED OSCILLATOR (VCO);" U.S. Patent Application Publication No. 2005-0040901, entitled "SYSTEM AND METHOD FOR MEASURING CURRENT;" and, U.S. Patent Application Publication No. 2005-0043909, entitled "A METHOD FOR MEASURING INTEGRATED CIRCUIT PROCESSOR POWER DEMAND AND ASSOCIATED SYSTEM," filed concurrently herewith, the disclosures of which are hereby incorporated by reference herein in their entirety.

BACKGROUND

Integrated circuit microprocessors or CPUs are typically designed for worst-case conditions that may include parameters that are critical to the VLSI design, such as frequency, power, voltage, current, and temperature. Some integrated circuit and CPU designs assume a standard set of conditions that require guard-banding. In these designs, the allowable operating conditions for the CPU are set so that the CPU design limits cannot be reached. For example, although a processor is capable of operating at 130 Watts under normal operating conditions, it may be guard-banded and hence specified to operate at 100 Watts to prevent the processor from exceeding the design limit.

In some designs, processors monitor a particular error condition and operate so as to not exceed that parameter. For example, a temperature measurement circuit having a trip point is used to notify the processor of a thermal problem. Such thermal monitoring circuits typically monitor only a single location on the processor's integrated circuit. As a result, unmonitored sections of the integrated circuit may be operating at temperatures exceeding the design limits or those sections may be operating at a temperature well below the design limit when a monitored section trips the thermal warning. This type of thermal monitoring is not efficient and does not allow the processor to operate at optimal conditions.

In other designs, the processor is characterized across all operating conditions to determine a worse-case power or frequency value. The processor is then limited or guard-banded to this worst-case condition, which may occur only under rarely used conditions. This prevents the processor from using more efficient power values and frequencies during typical operations.

The prior art solutions using guard-banding or external monitoring circuits are incapable of controlling the VLSI environment of the processor. Prior art circuits for monitoring discrete variables do not communicate with each other and, therefore, do not provide for VLSI parameter optimization across multiple variables. Additionally, such discrete circuits offer limited recourse to correct typical CPU problems such as high operating temperatures or high system power. For example, a prior art solution may provide a thermal trip circuit that completely disables a processor if an excessively high temperature is reached. This solution would be incapable of providing graceful performance throttling under such conditions.

SUMMARY

One embodiment of the invention includes a system comprising an integrated circuit on a VLSI die, and an embedded micro-controller constructed on the VLSI die, the micro-controller adapted to monitor and control the VLSI environment to optimize the integrated circuit operation.

Another embodiment of the invention includes a method for monitoring and controlling an integrated circuit comprising providing an embedded micro-controller on a same VLSI die as the integrated circuit, and monitoring and controlling a VLSI environment of the integrated circuit with the embedded micro-controller.

Another embodiment of the invention includes a computer program product comprising a computer usable medium having computer readable program code embedded therein, the computer readable program code comprising code for controlling an embedded micro-controller constructed on a VLSI integrated circuit die with a processor, wherein the micro-controller monitors and controls a VLSI environment of the processor.

An additional embodiment of the invention includes a system for monitoring and controlling an integrated circuit comprising means for providing an embedded micro-controller on a same VLSI die as the integrated circuit, and means for monitoring and controlling a VLSI environment of the integrated circuit with the embedded micro-controller.

DETAILED DESCRIPTION

A microprocessor system includes an embedded micro-controller that is constructed directly on the same integrated circuit die as a large VLSI CPU. The micro-controller's purpose is to control the VLSI environment, including, but not limited to, the power, temperature, voltage, current, frequency, and cooling air supply. The embedded, on-die micro-controller may employ a system of sensors and actuators to process the VLSI environment information, to determine an optimal operating solution, and to control the VLSI environment to achieve that solution.

The micro-controller may perform the following functions to monitor and control the integrated circuit environment: control power consumption, monitor and limit on-die temperature, adjust frequency based on voltage, adjust power supply voltage, and monitor die current consumption. Using the embedded micro-controller on the VLSI CPU die, the system can take many parameters into account for the particular die running in the context of a particular system environment. The micro-controller in some embodiments optimizes the VLSI parameters to provide an environment that will allow the CPU to operate as close to its design parameters as possible.

For example, the micro-controller may monitor voltage and current and may use those parameters to compute the system power. The micro-controller may use the power computation to adjust the power supply voltage as part of a feedback control system to control system power levels. The micro-controller may also be used as a digital filter to insure feedback stability of the power control loop.

The micro-controller may monitor temperature and may adjust power to gracefully limit on-die temperature. Alternatively, the micro-controller may adjust frequency based on die voltage and temperature to prevent over-temperature conditions. The micro-controller may adjust voltage to the level that is required to support a given frequency.

The embedded micro-controller may consider all of the above-listed factors and more simultaneously and may use VLSI optimization algorithms that are implemented in firmware. The micro-controller provides advantages such as minimizing guard-banding, real time control and adjustment of the VLSI environment, flexibility to change the algorithms by re-programming the micro-controller firmware either to correct bugs or to offer customized solutions using software, and the ability to optimize across many variables. The use of an on-die micro-controller may enable a large VLSI CPU to adapt to and to control its specific operating environment.

Figure 1:
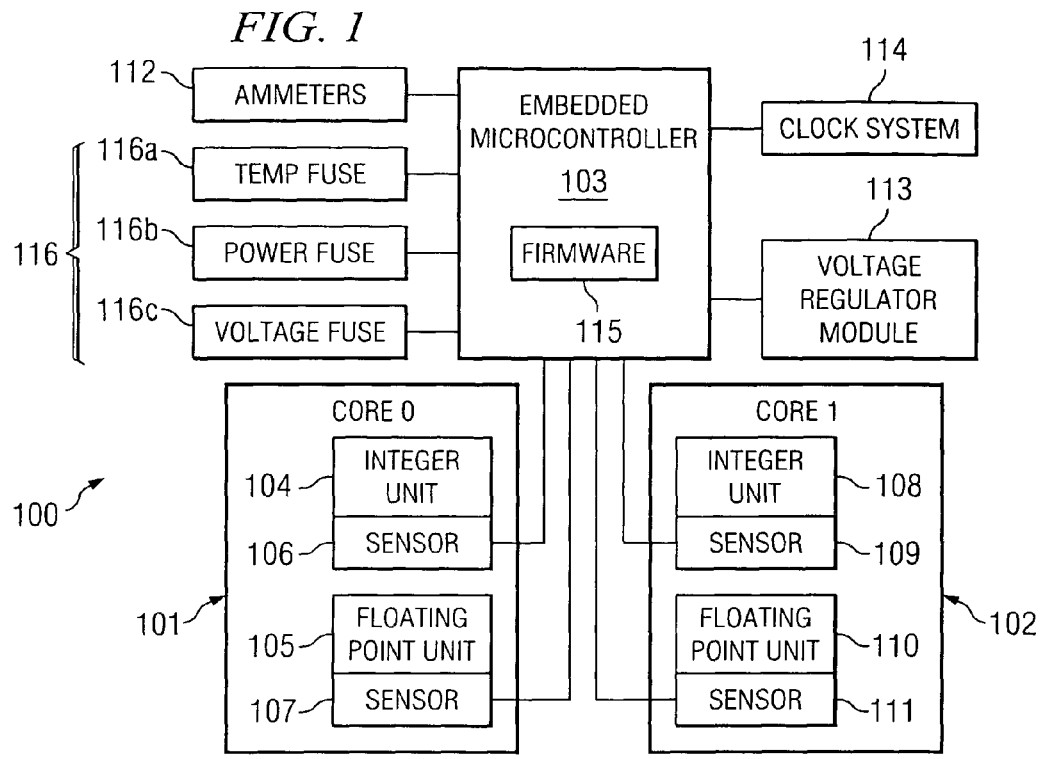
FIG. 1 illustrates an embedded micro-controller according to one embodiment of the invention.

FIG. 1 illustrates an exemplary embedded micro-controller according to one embodiment of the invention. System 100 is a simplified, high-level block diagram illustrating a VLSI die for a CPU. The CPU includes two core processors 101 and 102 that are constructed on the same die as micro-controller 103. Each of the cores may include an integer unit and a floating point unit. Temperature sensors may be located near each integer unit and floating point unit. In core 101, temperature sensor 106 monitors integer unit 104 and temperature sensor 107 monitors floating point unit 105. In core 102, temperature sensor 109 monitors integer unit 108 and temperature sensor 111 monitors floating point unit 110.

In a preferred embodiment, the temperature sensors may be diodes coupled to a current source. The diodes are preferably sensitive to temperature and the voltage drop across the diode may vary with temperature, such as −1.7 mV/° C. Micro-controller 103 measures the voltage drop across the diode and uses the voltage information to calculate the temperature of the CPU core. The micro-controller may use analog-digital converters in the ammeters 112 to measure voltage.

The use of four separate temperature sensors allows micro-controller 103 to simultaneously monitor temperatures in different parts of the CPU and to get a more accurate measurement of the operating temperatures. Compared to prior art CPU designs, a lower threshold or maximum temperature, on the order of 90° C., can be used in the system of FIG. 1. Micro-controller 103 may respond to high temperatures (i.e. temperatures approaching 90° C. in any of the four sensors) by reducing the CPU power. Micro-controller 103 reduces the power by commanding voltage regulator module 113 to drop the power supply voltage or current that is provided to CPU cores 101, 102. In turn the available power will also drop. Ammeters 112 can be used to measure the current and power to the CPU. Micro-controller 103 may also reduce the CPU's operating frequency by reducing the CPU's clock frequency. Clock system 114 reduces the system clock frequency under command by micro-controller 103.

A high temperature detected in one core may indicate that that core has a heavier workload compared to the other core. For example, if the temperature at sensor 106 in core 101 is approaching the maximum value, while the other temperature sensors remain at a lower level, it may indicate that integer unit 104 of core 101 has a heavy workload and that integer unit 108 has a relatively light workload. Upon detecting this difference in temperatures, micro-controller 103 may instruct the CPU's operating system to redistribute the workload so that integer unit 108 picks up some of integer unit 104's work load, thereby lowering the operating temperature of core 101.

As illustrated by the proceeding example, the micro-controller optimizes the working conditions of system 100. Rather than shutting down a core under high temperature conditions, micro-controller 103 monitors temperature increases and gracefully lowers the core's performance level to keep the core temperature below the maximum limit. In a preferred embodiment, micro-controller 103 optimizes the environment of system 100 to maintain a designated power level, such as 100 W. However, temperature considerations may override the 100 Watts power goal. Accordingly, micro-controller 103 may reject settings that would allow the CPU cores to operate at 100 W, and that would cause an over-temperature condition, i.e. over 90° C. in one or both of the cores.

Micro-controller 103 includes firmware 115, which may comprise algorithms for determining how to respond to various temperature, power, and other parameters. Firmware 115 may be updated or replaced, for example by patch firmware, to fix "bugs" in system 101 or to provide a custom environment for the CPU. For example, system 100 may be ordinarily operated to maintain 100 Watts power and 90° C. max temperature. However, in some applications these conditions may be unsuitable, such as in a system such as a blade server with many CPUs. It may be difficult to cool the system if there are many heat-generating components, such as CPUs. A user may install updated or customized firmware 115 in micro-controller 103 so that, for example, system 100 is optimized to operate at a power level less than 100 Watts, such as 50 Watts, or at a maximum temperature less than 90° C.

In addition to software configuration information provided by firmware 115, fuses 116*a-c* provide hardware configuration control for micro-controller 103. If micro-controller 103 senses a voltage across one or more of fuses 116*a-c*, then micro-controller 103 will (or will not) provide optimization control for that parameter. For example, if temperature fuse 116*a* is not blown and micro-controller senses a voltage on that line, then micro-controller 103 will provide temperature control to processor cores 101 and 102 in system 100. In an alternative embodiment, micro-controller 103 provides temperature control to system 100 if no voltage is sensed across temperature fuse 116*a*. Similarly, the voltages appearing across fuses 116*b* and 116*c* may impact whether micro-controller 103 provides power and voltage control to system 100. Other fuses (not shown) may provide a hardware configuration for micro-controller 103 to control other system parameters.

Micro-controller 104 uses ammeters 112, which may be high-precision voltmeters, to measure CPU power. Ammeters 112 are used to calculate the current flowing into the CPU by measuring the voltage drop across a parasitic resistance, such as the resistance of the CPU package or the resistance of the power supply grid. Alternatively, micro-controller 103 may use a predetermined resistance value or may calculate the parasitic resistance, for example, through a calibration operation. The voltage and resistance values are used to calculate current and power for the CPU. A method and system for calibrating ammeters on a CPU die is disclosed in concurrently filed, copending U.S. Patent Application Publication No. 2005-0043909, entitled A METHOD OF AND SYSTEM FOR CONTINUOUS ON-DIE AMMETER CALIBRATION TO COMPENSATE FOR TEMPERATURE AND DRIFT ON-BOARD A MICROPROCESSOR, the disclosure of which is hereby incorporated by reference herein.

Micro-controller 103 may control the clock frequency in system 100 by adjusting the available voltage from the power supply. The clock frequency provided by clock system 114 is proportional to the available system voltage. As micro-controller 103 reduces the voltage, the frequency of the clock signal is reduced by clock system 114 to a rate that can be supported by the available power. As a result, cores 101 and 102 perform fewer operations per second when the power is lowered, which causes the temperature of the processor cores to drop. In other embodiments, micro-controller can control the clock frequency directly without adjusting the system voltage or power. This may result in a less-than-optimum configuration regarding the relationship between the VLSI environment's power and frequency, but may be desired in certain instances.

Micro-controller 103 is capable of considering many parameters simultaneously and using those parameters to optimize the CPU operation. Micro-controller 103 may consider the power, voltage, current, temperature, and frequency parameters of the CPUs current operating condition. Using the optimization algorithms in firmware 115, micro-controller 103 adjusts selected parameters to ensure that system 100 does not go into an over-temperature condition while maintaining operations at or near the design system power level.

Although the system illustrated in FIG. 1 shows two processor cores on a single die, those of skill in the art will understand that micro-controller 103 can also be used to control CPUs that comprise multiple dies and/or that include more than two processor cores on one or more dies. Moreover, micro-controller 103 can also be used to separately control the temperature and power for processor cores on multiple CPU dies. Furthermore, it will be understood by those of skill in the art that the present invention is not limited for monitoring and controlling processors or CPUs, but can be used to monitor and control the environment of any type of integrated circuit.

Figure 2:
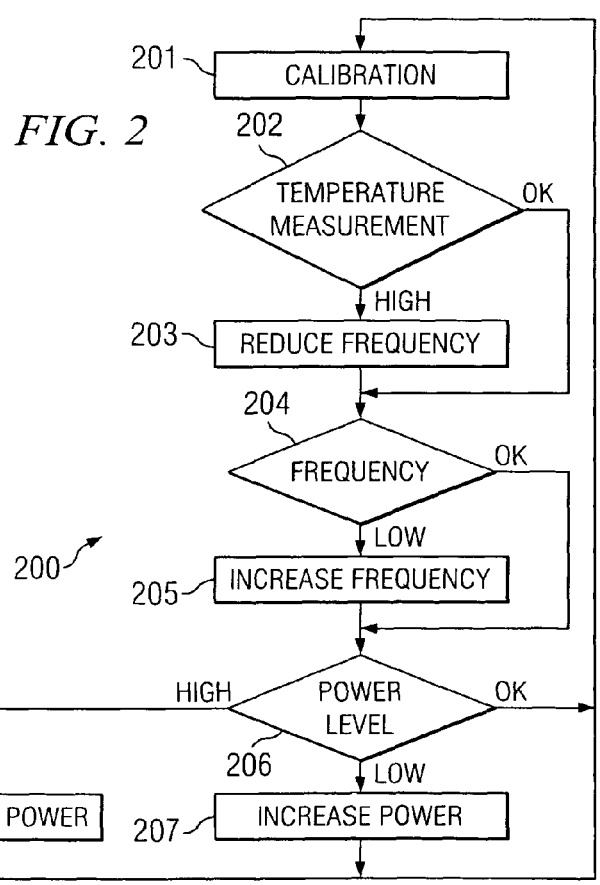
FIG. 2 is a flowchart illustrating an exemplary process used by an embedded, on-die micro-controller to monitor the VLSI environment of an integrated circuit.

FIG. 2 is a flowchart illustrating an exemplary process used by an embedded, on-die micro-controller to monitor and control the VLSI environment of a CPU. The micro-controller calibrates its sensors and/or look-up tables in 201. In a preferred embodiment, the calibration is part of an iterative process in which the micro-controller interleaves calibration steps with sensor measurements so that the calibration process does not interfere with the micro-controller's duties of monitoring and controlling the CPU environment.

In 202, the micro-controller monitors one or more temperature sensors for an over-temperature condition. If one or more temperature sensors indicate that an over-temperature condition exists, then process 200 moves to block 203 wherein the micro-controller reduces the clock frequency in an attempt to reduce the temperature of the processor core. In an alternative embodiment, at block 203, the micro-controller may reduce the CPU voltage which causes the clock frequency to decrease.

The micro-controller may detect an existing over-temperature condition at block 202. Alternatively, the micro-controller may compare a series of temperature readings to anticipate an over-temperature condition. For example, if each temperature measurement in a sequence of samples is higher than the previous measurement, then the micro-controller may react to prevent an expected maximum temperature. If the core temperature is within acceptable limits at block 202, but an over-temperature condition is projected, then micro-controller can anticipate the temperature problem and will move to block 203 to reduce the system frequency in order to avoid the over-temperature condition.

If the temperature is acceptable in block 202, or after the clock frequency has been reduced in 203, then the micro-controller measures the frequency in block 204. If the clock frequency is below a desired range, then micro-controller increases the clock frequency in block 205. To prevent the micro-controller from counteracting a prior frequency correction, such as a correction in block 203, the micro-controller considers any current temperature measurement corrections that are in place prior to increasing the clock frequency in block 204.

If the frequency is within an acceptable range at block 204, or after the frequency is corrected in block 205, the micro-controller measures the CPU power level in block 206. If the power level is within an acceptable range, the process begins again at 201. If the power level is below an optimal range, then the micro-controller increases the power level in block 207 and repeats the process. If the CPU power level is above an optimal range at block 206, then the micro-controller decreases power in block 208 and repeats the process. The micro-controller attempts to maintain the CPU operating at its design power level. However, high temperature conditions detected in block 202 may prevent the micro-controller from increasing the power level.

After the power level is checked and adjusted as needed in blocks 206 and 207, the micro-controller returns to the calibration operation at 201 where it performs another calibration operation prior to commencing another pass through the CPU environment monitoring operations.

Figure 3:
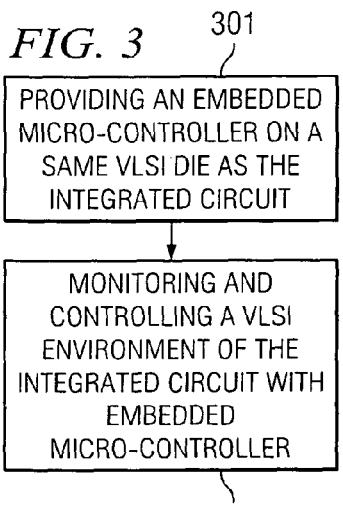
FIG. 3 illustrates a method for monitoring and controlling an integrated circuit.

FIG. 3 illustrates a method for monitoring and controlling an integrated circuit. The method comprises providing an embedded micro-controller on a same VLSI die as the integrated circuit, 301. The method further comprises monitoring and controlling a VLSI environment of the integrated circuit with the embedded micro-controller, 302.

What is claimed is:

1. A system comprising:
   an integrated circuit on a VLSI die; and
   an embedded micro-controller constructed on the VLSI die,
   wherein said embedded micro-controller is configured to:
      monitor temperatures at a plurality of locations on the integrated circuit;
      monitor one or more parameters selected from the group consisting of: power supplied to the integrated circuit, an operating clock frequency of the integrated circuit, a power supply voltage supplied to the integrated circuit, and a power supply current supplied to the integrated circuit; and
      control an environment of the VLSI die based on the monitored temperatures and the one or more parameters to enhance operation of the integrated circuit.

2. The system of claim 1 wherein the embedded micro-controller is configured to control at least one of the following:
   temperatures at one or more locations on the integrated circuit;
   the operating clock frequency of the integrated circuit;
   the power supply voltage supplied to the integrated circuit; and
   the power supply current supplied to the integrated circuit.

3. The system of claim 1 wherein the integrated circuit comprises two or more processor cores, each core having an integer unit and a floating point unit, the system further comprising:
   temperature sensors at each of the integer units and floating point units on each of the cores.

4. The system of claim 1 further comprising:
   embedded ammeters constructed on the VLSI die, the ammeters comprising voltage controlled oscillators.

5. The system of claim 1 further comprising:
   fuses that provide hardware selection of the one or more parameters to be monitored by the embedded micro-controller.

6. The system of claim 1 further comprising:
updateable or replaceable firmware for controlling operations of the embedded micro-controller; said firmware comprising:
algorithms for determining how to respond to temperature, power, voltage, or clock parameters.

7. The system of claim 1 wherein
said embedded micro-controller is further configured to detect a difference in temperatures between said plurality of locations on the integrated circuit and redistribute workload in response to said temperature difference.

8. A method for monitoring and controlling an integrated circuit comprising:
providing an embedded micro-controller on a same VLSI die as the integrated circuit;
monitoring, with the embedded micro-controller,
temperatures at a plurality of locations on the integrated circuit, and one or more parameters selected from the group consisting of: power supplied to the integrated circuit, an operating clock frequency of the integrated circuit, a power supply voltage supplied to the integrated circuit, and a power supply current supplied to the integrated circuit; and
controlling, with the embedded micro-controller, an environment of the VLSI die based on the monitored temperatures and the one or more parameters to enhance operation of the integrated circuit.

9. The method of claim 8 further comprising:
controlling, by the embedded micro-controller, one or more parameters selected from the group consisting of:
temperatures at one or more locations on the integrated circuit;
the operating clock frequency of the integrated circuit;
the power supply voltage supplied to the integrated circuit; and
the power supply current supplied to the integrated circuit.

10. The method of claim 8 further comprising:
controlling, using the embedded micro-controller, the environment to optimize an integrated circuit operating power level to approach a design limit.

11. The method of claim 8 further comprising:
monitoring, using the embedded micro-controller, a temperature in a particular location of the integrated circuit; and
reducing, using the embedded micro-controller, the power supply voltage in response to an over-temperature condition in the particular location.

12. The method of claim 8 further comprising:
reducing, using the embedded micro-controller, the operating clock frequency in response to an over-temperature condition in the integrated circuit.

13. The method of claim 8 wherein the integrated circuit is a processor, the method further comprising:
monitoring, using the embedded micro-controller, a temperature in a first core of the processor; and
transferring, using the embedded micro-controller, a processing workload from the first core to a second core of the processor in response to the temperature of said first core.

14. The method of claim 8 further comprising:
monitoring, using the embedded micro-controller, the power supply current using ammeters comprising one or more voltage controlled oscillators.

15. The method of claim 8 wherein
said embedded micro-controller detects a difference in temperatures between said plurality of locations on the integrated circuit and redistributes workload in response to said temperature difference.

16. A computer program product comprising a non-transitory computer usable medium having computer readable program code embedded therein, the computer readable program code comprising:
code for controlling an embedded micro-controller constructed on a VLSI die with an integrated circuit, wherein the code is for controlling the micro-controller to:
monitor temperatures at a plurality of locations on the integrated circuit;
monitor one or more parameters selected from the group consisting of: power supplied to the integrated circuit, an operating clock frequency of the integrated circuit, a power supply voltage supplied to the integrated circuit, and a power supply current supplied to the integrated circuit; and
control an environment of the VLSI die based on the monitored temperatures and the one or more parameters to enhance operation of the integrated circuit.

17. The computer program product of claim 16 further comprising:
code for controlling the embedded micro-controller to control one or more parameters selected from the group consisting of:
temperatures at one or more locations on the integrated circuit;
the operating clock frequency of the integrated circuit;
the power supply voltage supplied to the integrated circuit; and
the power supply current supplied to the integrated circuit.

18. The computer program product of claim 16 further comprising: code for controlling the environment to optimize an integrated circuit operating power level to approach a design limit.

19. The computer program product of claim 16, wherein the integrated circuit comprises a processor, the method further comprising:
code for monitoring a temperature in a core of the processor; and
code for reducing the power supply voltage in response to an over-temperature condition in the core.

20. The computer program product of claim 16, wherein the integrated circuit comprises a processor, the method further comprising:
code for monitoring a temperature in a core of the processor; and
code for reducing the operating clock frequency in response to an over-temperature condition in the core.

21. The computer program product of claim 16, wherein the integrated circuit comprises a processor, the method further comprising:
code for monitoring a temperature in a first core of the processor; and
code for transferring a processing workload from the first core to a second core of the processor in response to the temperature of said first core.

22. The computer program product of claim 16 further comprising:
code for monitoring current levels in the integrated circuits using ammeters comprising one or more voltage controlled oscillators.

23. The computer program product of claim 16 where
said embedded micro-controller detects a difference in temperatures between said plurality of locations on the integrated circuit and redistributes workload in response to said temperature difference.

24. A system for monitoring and controlling an integrated circuit comprising:
    means for providing an embedded micro-controller on a same VLSI die as the integrated circuit; and
    means for controlling the embedded micro-controller to:
        monitor temperatures at a plurality of locations on the integrated circuit;
        monitor one or more parameters selected from the group consisting of: power supplied to the integrated circuit, an operating clock frequency of the integrated circuit, a power supply voltage supplied to the integrated circuit, and a power supply current supplied to the integrated circuit; and
        control an environment of the VLSI die based on the monitored temperatures and the one or more parameters to enhance operation of the integrated circuit.

25. The system of claim 24 further comprising:
    means for controlling, using the embedded micro-controller, the environment to optimize an integrated circuit operating power level to approach a design limit.

26. The system of claim 24 further comprising:
    means for reducing, using the embedded micro-controller, the power supply voltage in response to an over-temperature condition at one of said plurality of locations.

27. The system of claim 24 further comprising:
    means for reducing, using the embedded micro-controller, the operating clock frequency in response to an over-temperature condition in the integrated circuit.

28. The system of claim 24 wherein the integrated circuit is a processor, the method further comprising:
    means for monitoring, using the embedded micro-controller, a temperature in a first core of the processor; and
    means for transferring, using the embedded micro-controller, a processing workload from the first core to a second core of the processor in response to the temperature of said first core.

29. The system of claim 24 where
    said embedded micro-controller detects a difference in temperatures between said plurality of locations on the integrated circuit and redistributes workload in response to said temperature difference.

* * * * *